(12) United States Patent
Murata et al.

(10) Patent No.: US 7,656,010 B2
(45) Date of Patent: Feb. 2, 2010

(54) SEMICONDUCTOR DEVICE

(75) Inventors: Tomohiro Murata, Osaka (JP); Hiroaki Ueno, Osaka (JP); Hidetoshi Ishida, Osaka (JP); Tetsuzo Ueda, Osaka (JP); Yasuhiro Uemoto, Shiga (JP); Tsuyoshi Tanaka, Osaka (JP); Daisuke Ueda, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/898,958

(22) Filed: Sep. 18, 2007

(65) Prior Publication Data

US 2008/0067546 A1    Mar. 20, 2008

(30) Foreign Application Priority Data

Sep. 20, 2006  (JP) .............................. 2006-253920

(51) Int. Cl.
*H01L 23/58* (2006.01)
(52) U.S. Cl. ........................ 257/635; 257/192
(58) Field of Classification Search ................ 257/635, 257/640, 192, 194, 280, 488
See application file for complete search history.

(56) References Cited

U.S. PATENT DOCUMENTS 5,183,684 A * 2/1993 Carpenter .................. 427/574
6,100,571 A * 8/2000 Mizuta et al. ............... 257/488
7,304,331 B2 * 12/2007 Saito et al. .................. 257/192
7,332,795 B2 * 2/2008 Smith et al. ................. 257/635
7,419,892 B2 * 9/2008 Sheppard et al. ............ 438/522

FOREIGN PATENT DOCUMENTS

| JP | 2002-198563 | 7/2002 |
|---|---|---|
| JP | 2006-32552 | 2/2006 |
| JP | 2006-156429 | 6/2006 |

OTHER PUBLICATIONS

Vertiachikh, A.V., et al., "Effect of surface passivation of AlGaN/GaN heterostructure field-effect transistor", Electronics Letters, Apr. 2002, pp. 388-389, vol. 38 No. 8.

* cited by examiner

*Primary Examiner*—Mark Prenty
(74) *Attorney, Agent, or Firm*—McDermott Will & Emery LLP

(57) ABSTRACT

A semiconductor device includes: a semiconductor layer; at least one electrode formed on a semiconductor layer to be in contact with the semiconductor layer; and a passivation film covering the semiconductor layer and at least part of the top surface of the electrode to protect the semiconductor layer and formed of a plurality of sub-films. The passivation film includes a first sub-film made of aluminum nitride.

5 Claims, 8 Drawing Sheets

SEMICONDUCTOR DEVICE

CROSS-REFERENCE TO RELATED APPLICATIONS

The disclosure of Japanese Patent Application No. 2006-253920 filed on Sep. 20, 2006 including specification, drawings and claims is incorporated herein by reference in its entirety.

BACKGROUND OF THE INVENTION (1) Field of the Invention

The present invention relates to semiconductor devices for use in millimeter wave communications or power switching applications.

(2) Description of Related Art

Group III nitride semiconductors typified by gallium nitride (GaN) and serving as a mixed crystal material represented by the general formula $(In_xAl_{1-x})_yGa_{1-y}N$ (where $0 \leq x \leq 1$ and $0 \leq y \leq 1$), have been expected to be applied not only to light-emitting devices for emitting visible or ultraviolet light by utilizing their physical features, i.e., a wide band gap, and a direct transition band structure, but also to electronic devices by utilizing their features, i.e., high breakdown voltage and high saturated electron velocity. Particularly, a heterojunction field effect transistor (hereinafter abbreviated as HFET) which employs 2 dimensional electron gas (hereinafter abbreviated as 2DEG) occurring at the interface between epitaxially grown $Al_xGa_{1-x}N$ and GaN has excellent properties of high current density and high breakdown voltage. The high current density results from the high sheet carrier density of the 2DEG, and the high breakdown voltage results from the wide energy band gap of AlGaN and GaN. As a result, HFETs have been expected as high-power and high-frequency devices and have been earnestly studied and developed.

For a semiconductor device made of a Group III nitride semiconductor, as described in, for example, A. V. Vertiatchikh, L. F. Eastman, W. J. Schaff and T. Prunty, "Effect of surface passivation of AlGaN/GaN heterostructure field-effect transistor", Electronics Letters vol. 38, pp. 388-389 (2002), a silicon nitride film is typically used as a surface protection film (SiN passivation).

Furthermore, in addition to the SiN passivation, a method in which an epitaxially grown aluminum nitride (AlN) layer is used as part of a passivation film has been suggested (see, for example, Japanese Unexamined Patent Application Publication No. 2006-279032).

When the surface of a known gallium nitride based HFET is covered with a passivation film made of silicon nitride (SiN), this prevents heat from being dissipated from the device surface. The reason for this is that SiN used as the passivation film has small thermal conductivity. In particular, for a high-power transistor, a large drain current flows in the vicinity of the device surface. This allows the device temperature to reach several hundred degrees. Such an increase in the device temperature causes degradation in device characteristics, such as a reduction in the drain current. This makes it essential that heat is efficiently dissipated from the device.

Furthermore, when, instead of the deposited film made of silicon nitride, an epitaxial layer made of aluminum nitride is used as a passivation film, the step of selectively removing a region of the AlN epitaxial layer in which an ohmic electrode is to be formed (hereinafter, referred to as "ohmic electrode formation region") by dry etching or any other method is further required. In addition, when the AlN epitaxial layer is subjected to dry etching, etching damage is caused also to an ohmic electrode formation region, leading to an increase in contact resistance.

SUMMARY OF THE INVENTION

The present invention is made to solve the above-mentioned problems, and its object is to improve heat dissipation from the surface of a semiconductor device and achieve high-power operations.

In order to achieve the above-described object, the present invention is configured as follows. A passivation film covering a semiconductor layer and at least one electrode is formed of a deposited film consisting of at least two layers having different compositions, and aluminum nitride is used as a material of one of the layers.

More specifically, a semiconductor device includes: a semiconductor layer; at least one electrode formed on a semiconductor layer to be in contact with the semiconductor layer; and a passivation film covering the semiconductor layer and at least part of the top surface of the electrode to protect the semiconductor layer and formed of a plurality of sub-films. The passivation film includes a first sub-film made of aluminum nitride.

According to the semiconductor device of the present invention, heat generated from the semiconductor device can be efficiently diffused by aluminum nitride having higher thermal conductivity than silicon nitride. This can suppress an increase in the temperature of the semiconductor device and thus prevent degradation in device characteristics due to a temperature rise.

In the semiconductor device of the present invention, the aluminum nitride forming the first sub-film is preferably amorphous or polycrystalline.

Thus, a film of amorphous or polycrystalline aluminum nitride can be deposited, for example, by sputtering, at a temperature low enough to prevent an influence (degradation in device characteristics due to heat) from being exerted upon the electrode. Therefore, aluminum nitride can be deposited after the formation of the electrode. This eliminates the need for forming an opening for the formation of the electrode in the deposited aluminum nitride. As a result, the aluminum nitride can completely cover the entire surface of the semiconductor layer.

In the semiconductor device of the present invention, the passivation film preferably includes a second sub-film covering the first sub-film and made of silicon nitride.

Thus, the first sub-film made of aluminum nitride provides high heat dissipation. Furthermore, since the first sub-film is covered with the second sub-film made of silicon nitride, this can prevent the device degradation due to ambient moisture.

In the semiconductor device of the present invention, the passivation film preferably includes a second sub-film formed under the first sub-film and made of silicon nitride.

Thus, high heat dissipation of the first sub-film made of aluminum nitride can prevent degradation in device characteristics due to a temperature rise. Furthermore, in a case where the semiconductor device is a FET, since silicon nitride has the effect of deactivating surface traps, this can prevent deterioration in high-frequency characteristics.

In the semiconductor device of the present invention, the semiconductor layer is preferably made of a Group III nitride semiconductor.

In the semiconductor device of the present invention, the at least one electrode preferably comprises a gate electrode and a source electrode and a drain electrode located to both sides of the gate electrode, respectively, and apart from the gate electrode.

In the semiconductor device of the present invention, the semiconductor layer may be formed on a substrate having smaller thermal conductivity than aluminum nitride.

Thus, even with the structure in which heat is less likely to escape from the semiconductor layer toward the substrate, the passivation film covering the semiconductor layer and the at least one electrode and exhibiting good heat dissipation can improve heat dissipation of the device.

In the semiconductor device of the present invention, the surface of the passivation film is preferably uneven.

This can increase the surface area of the passivation film. As a result, heat dissipation of the passivation film can be further improved.

In the semiconductor device of the present invention, the first sub-film preferably has a thickness of 1 μm or more.

Thus, for example, in the case where the semiconductor device is the FET, the temperature inside a channel of the FET can be reduced to 580 K (approximately 300° C.) or less. This can prevent degradation in FET characteristics due to a temperature rise.

It is preferable that the semiconductor device of the present invention further includes a heat dissipation film formed on the passivation film and made of a material having larger thermal conductivity than aluminum nitride.

In this case, the heat dissipation film is preferably made of a metal, diamond, diamond-like carbon, or a material containing carbon.

Thus, even when aluminum nitride forming the passivation film is strongly oriented, the heat dissipation film made of a metal, diamond or any other material can still further improve heat dissipation of the passivation film independently of the orientation of crystals of aluminum nitride.

Furthermore, it is preferable that when the heat dissipation film is made of a metal, the heat dissipation film is electrically connected to the electrode.

Thus, since the gate, source or drain electrode of the FET is connected to the heat dissipation film on the passivation film, this not only allows the heat dissipation film to have the effect of promoting heat diffusion in the direction parallel to the semiconductor layer (in the in-plane direction of the semiconductor layer) but also suppresses the electric field concentration between the gate electrode and the drain electrode, resulting in improvement in the breakdown voltage of the FET. In the case of the FET, a part of the semiconductor device which most significantly increases in temperature, i.e., a part thereof between the gate electrode and the drain electrode, is formed with a heat dissipation film, thereby efficiently diffusing heat.

DETAILED DESCRIPTION OF THE INVENTION

Embodiment 1

A first embodiment of the present invention will be described with reference to the drawings.

Figure 1:
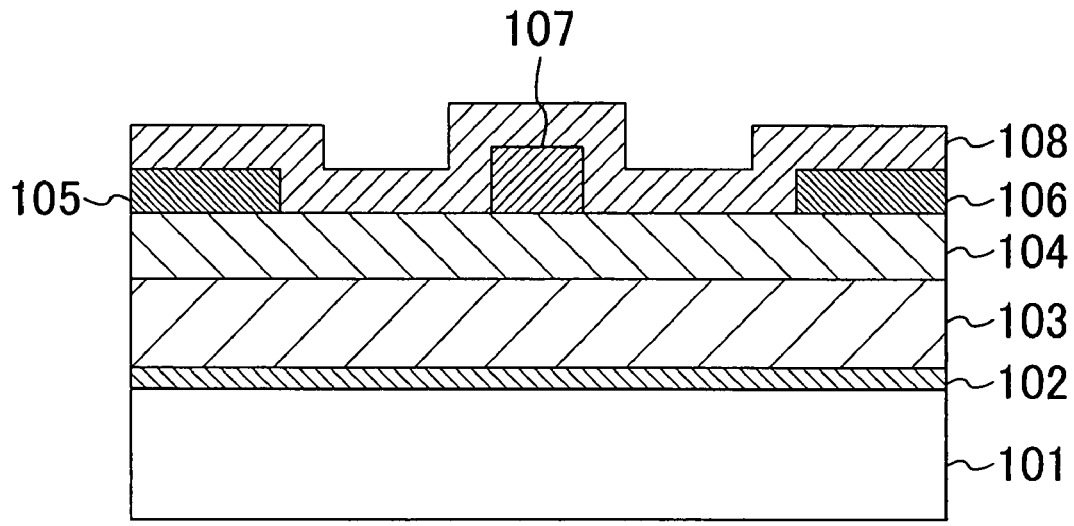
FIG. 1 is a cross-sectional view illustrating a semiconductor device according to a first embodiment of the present invention.

FIG. 1 illustrates a cross-sectional structure of a semiconductor device according to the first embodiment of the present invention. As illustrated in FIG. 1, a buffer layer 102 made of aluminum nitride (AlN), an underlying layer 103 made of gallium nitride (GaN) and a barrier layer 104 made of $Al_{0.26}Ga_{0.74}N$ are sequentially formed on a substrate 101 made of sapphire (single crystal $Al_2O_3$), for example, by metal organic chemical vapor deposition (MOCVD).

A source electrode 105 and a drain electrode 106 both made of titanium (Ti) and aluminum (Al) are formed on the barrier layer 104 so as to be spaced, and a gate electrode 107 made of an alloy of palladium and silicon (PdSi) is formed between the source electrode 105 and the drain electrode 106, thereby forming a field effect transistor (FET).

A passivation film 108 made of aluminum nitride (AlN) is deposited, for example, by DC (direct current) sputtering to cover the barrier layer 104, the source electrode 105, the drain electrode 106, and the gate electrode 107. Here, [Table 1] shows a material of each of the layers of the semiconductor device according to the first embodiment and the thickness of the layer, and [Table 2] shows the width of each of the electrodes and the distance between each adjacent pair of the electrodes.

TABLE 1

|  | Material or composition | Thickness |
| --- | --- | --- |
| Buffer layer 102 | AlN | 200 nm |
| Underlying layer 103 | GaN | 3 μm |
| Barrier layer 104 | $Al_{0.26}Ga_{0.74}N$ | 25 nm |
| Passivation film 108 | AlN | 0.1 μm |

TABLE 2

|  |  |
| --- | --- |
| Gate length | 1 μm |
| Gate width (channel width) | 100 μm |
| Distance between respective opposed end surfaces of source electrode 105 and gate electrode 107 | 2 μm |
| Distance between respective opposed end surfaces of drain electrode 106 and gate electrode 107 | 2 μm |

Since, in the first embodiment, aluminum nitride (AlN) is deposited by DC sputtering, the temperature at which AlN is deposited can be reduced to approximately 200° C. or less. This prevents thermal damage from being caused to the previously formed gate electrode 107.

Figure 2:
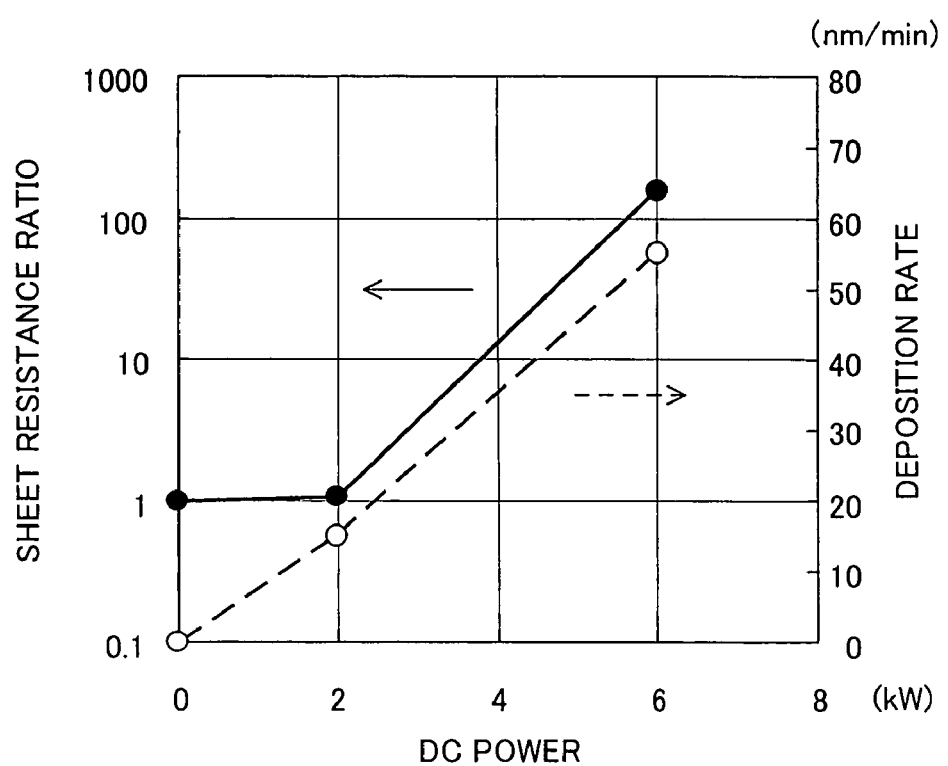
FIG. 2 is a graph illustrating the dependences of the sheet resistance ratio between the sheet resistance of the semiconductor device of the first embodiment of the present invention having a heterojunction structure after the formation of an AlN passivation film using a sputtering method and the sheet resistance thereof before the formation of the passivation film and the deposition rate of the AlN on the DC power for sputtering.

However, since, in sputtering, high-energy particles sputtered from a target reach the device surface, it is feared that these sputtered particles will cause damage to the device. In order to prevent damage from being caused to the device, sputtering conditions are set in the following manner. The energy of the sputtered particles is determined by the DC power in sputtering. Therefore, in order to reduce sputter damage, the DC power needs to be reduced. Meanwhile, when the DC power is reduced too much, this cannot provide a sufficiently high deposition rate. Therefore, an optimum DC power needs to be found. To satisfy the need, sputtering is conducted with variations in the DC power, and the ratio between the sheet resistance of an AlGaN/GaN heterojunction structure after sputtering and that of the heterojunction structure before sputtering was measured to evaluate damage. FIG. 2 illustrates the dependences of the sheet resistance ratio obtained by normalizing the sheet resistance of a heterojunction structure after sputtering in terms of the sheet resistance thereof before sputtering and the deposition rate on the DC power. Sputtering damage caused to the heterojunction structure increases the sheet resistance, resulting in an increase in the sheet resistance ratio.

FIG. 2 also illustrates the deposition rate of AlN under each DC power condition. It is seen from FIG. 2 that when in the first embodiment the DC power is 2 kW, this provides a deposition rate of 15 nm/min, and, at this time, the sheet resistance ratio is approximately 1. This means that sputtering damage is hardly caused. In view of the above, in the first embodiment, aluminum nitride (AlN) is deposited with the DC power set at 2 kW.

Figure 3A:
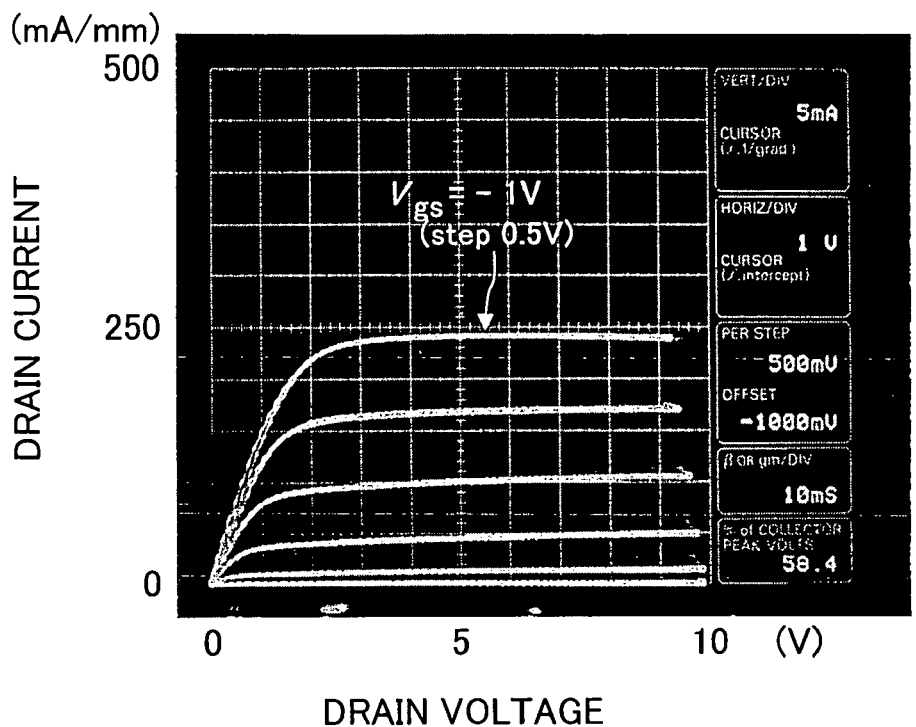
FIG. 3A is a graph illustrating the measurement results of drain current-voltage characteristics of the semiconductor device of the first embodiment of the present invention after the formation of the passivation film.
Figure 3B:
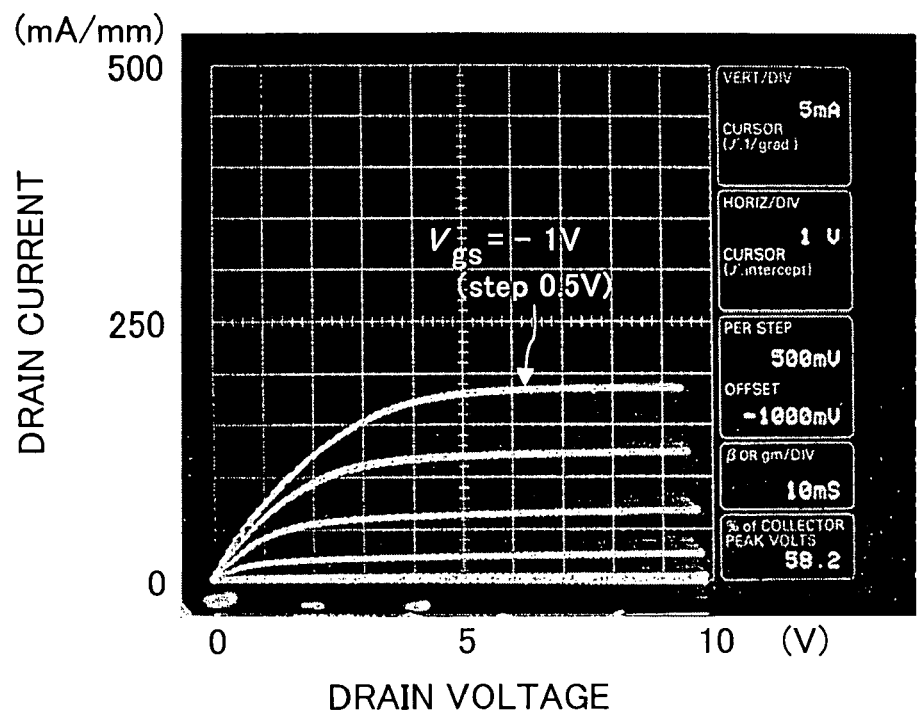
FIG. 3B is a graph illustrating, as a comparative example, the measurement results of drain current-voltage characteristics of the semiconductor device before the formation of the passivation film.

FIGS. 3A and 3B illustrate drain current-voltage characteristics of a FET before and after deposition of a passivation film made of AlN, which are measured by a curve tracer. It is seen from FIGS. 3A and 3B that after the deposition of the passivation film (FIG. 3A), as compared with before the deposition of the passivation film (FIG. 3B), the ON resistance of the FET is reduced from 12.8 Ωmm to 6.6 Ωmm and the drain current in the application of a gate voltage (Vg) of −1V to the FET is increased from 185 mA/mm to 242 mA/mm. The reason for this is considered that the formation of the passivation film made of AlN allows the surface potential or polarization charge to vary, resulting in an increase in the concentration of 2DEG. Meanwhile, the characteristics of a Group III nitride semiconductor are deteriorated by a so-called current collapse in which the drain current is reduced due to the influence of surface traps. It has conventionally been known that silicon nitride passivation can suppress the degradation in the characteristics. Furthermore, it can be recognized that an HFET provided with a passivation film made of AlN can also suppress the current collapse as compared with an HFET provided without a passivation film. Thus, it is considered that, also in the case of the passivation film of the present invention, the same mechanism for suppressing the current collapse as in the case of a known passivation film made of SiN works.

Figure 4:
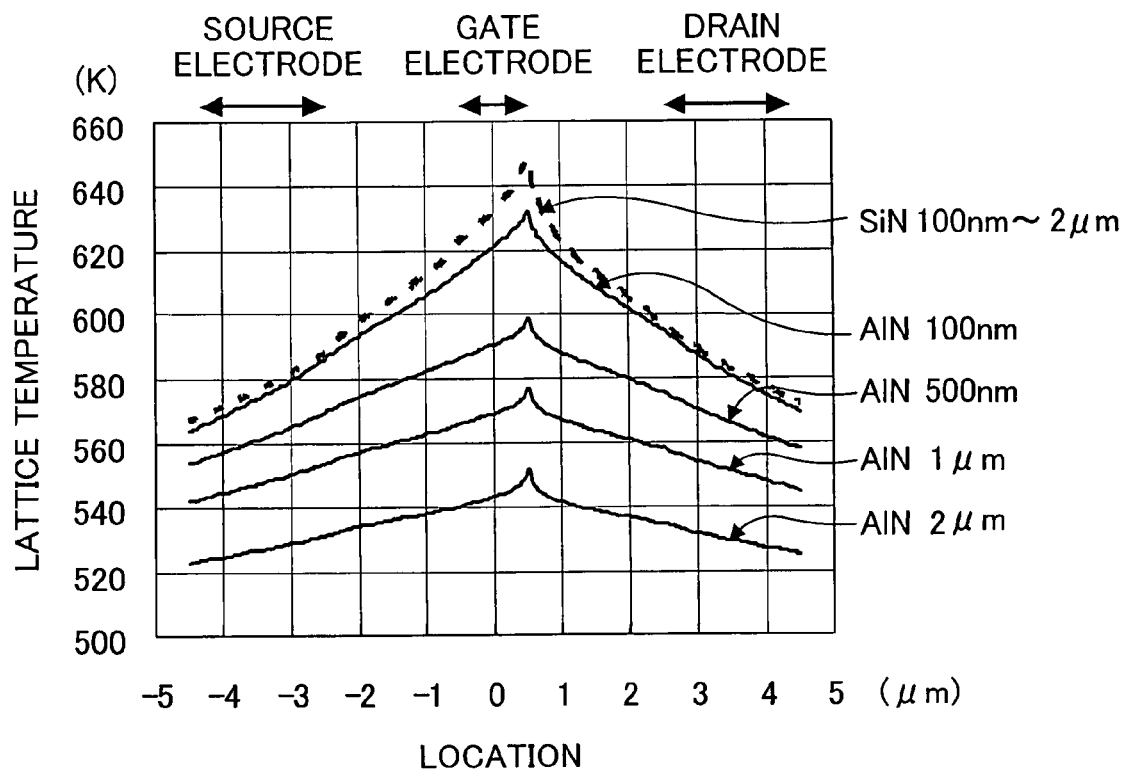
FIG. 4 is a graph determined by simulating the dependence of the lattice temperature in the vicinity of a channel of the semiconductor device of the first embodiment of the present invention on the composition and thickness of the passivation film.

FIG. 4 illustrates the relationship between the thickness of each of passivation films of AlGaN/GaN HFETs and the associated heat dissipation effect. This relationship was determined by simulating the lattice temperature near the channel of each of the AlGaN/GaN HFETs provided with a passivation film made of AlN (whose thermal conductivity is approximately 285 W/mK) and a known passivation film made of SiN (whose thermal conductivity is approximately 1 W/mK), respectively.

It is seen from FIG. 4 that the lattice temperature near the channel of the HFET provided with the passivation film of AlN is lower than that of the HFET provided with the known passivation film of SiN. Furthermore, it is also seen from FIG. 4 that while the lattice temperature near the channel of the HFET provided with the known passivation film of SiN does not vary even with an increase in the thickness of the known passivation film, the lattice temperature near the channel of the HFET provided with the passivation film of AlN is more significantly reduced with an increase in the thickness of the passivation film of AlN. Moreover, it is also seen from FIG. 4 that when the thickness of AlN is 1 μm or more, the lattice temperature near the channel can be reduced to approximately 300° C. (573K) or less.

Thus, the passivation film made of AlN according to the first embodiment can prevent degradation in FET characteristics due to a temperature rise.

When a substrate made of sapphire exhibiting poor heat dissipation is used, the heat dissipation effect of the passivation film according to the first embodiment is increasingly apparent. Meanwhile, use of a substrate made of silicon or gallium nitride also provides the similar effect.

In the first embodiment, aluminum nitride (AlN) is used as a material of the buffer layer 102. Alternatively, gallium nitride (GaN) that has grown at a low temperature of approximately 500 through 600° C. may be used.

The numerical values illustrated in [Table 1] and [Table 2] are merely exemplary, and as long as the effect of the present invention is achieved, the numerical values illustrated therein are not limited. This is applied also to the following embodiments.

Embodiment 2

A second embodiment of the present invention will be described hereinafter with reference to the drawings.

Figure 5:
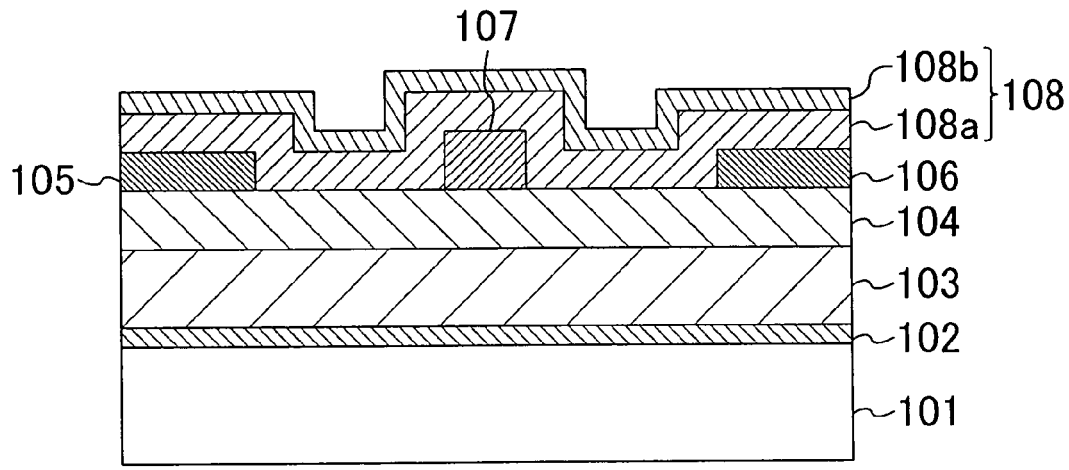
FIG. 5 is a cross-sectional view illustrating a semiconductor device according to a second embodiment of the present invention.

FIG. 5 illustrates a cross-sectional structure of a semiconductor device according to the second embodiment of the present invention. In FIG. 5, the same components as those illustrated in FIG. 1 are denoted by the same reference numerals, and thus the description thereof is omitted.

As illustrated in FIG. 5, the semiconductor device of the second embodiment is configured such that a passivation film 108 is formed of a first sub-film 108a made of aluminum nitride (AlN) and a second sub-film 108b covering the first sub-film 108b and made of silicon nitride (SiN).

The passivation film 108 of the second embodiment is formed in the following manner: A first sub-film 108a made of AlN is deposited by DC sputtering as in the first embodiment, and then a second sub-film 108b made of SiN is deposited, for example, by plasma CVD to cover the first sub-film 108a.

In general, aluminum nitride (AlN) deposited by sputtering does not have sufficiently high water resistance as compared with silicon nitride (SiN). Thus, the semiconductor device using aluminum nitride as a material of the passivation film 108 may be deteriorated.

To cope with this, in the second embodiment, the passivation film 108 has a multilayer structure composed of the first sub-film 108a made of AlN and the second sub-film 108b made of SiN. This structure can block moisture and oxygen from outside to prevent degradation of the device of the second embodiment. The second sub-film 108b is desirably thin enough to prevent impairment of heat dissipation from the first sub-film 108a. More specifically, the thickness of the second sub-film 108b is preferably 1 through 100 nm.

The thickness of the first sub-film 108a made of AlN is desirably larger as seen from the simulation results of the lattice temperatures near the channel illustrated in FIG. 4. For example, when the thickness of the first sub-film 108a made of AlN is 1 μm or more, this allows the lattice temperature near the channel to be approximately 300° C. (approximately 580 K) or less.

Immediately after the deposition of the first sub-film 108a, the second sub-film 108b may be deposited without being exposed to air. In this manner, the second sub-film 108b can be deposited on the first sub-film 108a with the first sub-film 108a kept clean.

Embodiment 3

A third embodiment of the present invention will be described hereinafter with reference to the drawings.

Figure 6A:
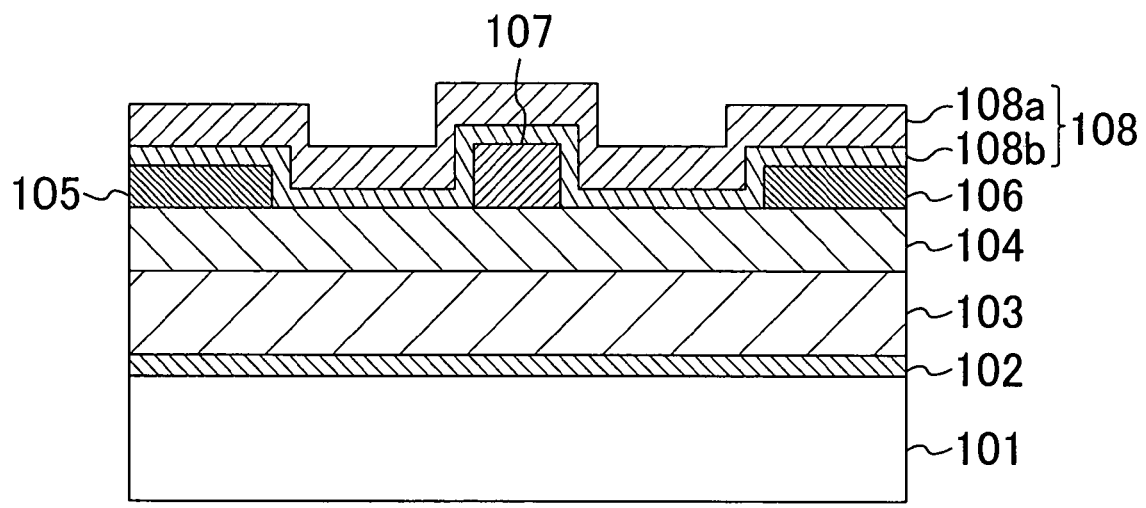
FIG. 6A is a cross-sectional view illustrating a semiconductor device according to a third embodiment of the present invention.

FIG. 6A illustrates a cross-sectional structure of a semiconductor device according to a third embodiment of the present invention. In FIG. 6A, the same components as those illustrated in FIG. 1 are denoted by the same reference numerals, and thus the description thereof is omitted.

As illustrated in FIG. 6A, the semiconductor device of the third embodiment is configured such that a passivation film 108 is formed of a second sub-film 108b made of silicon nitride (SiN) and a first sub-film 108a covering the second sub-film 108b and made of aluminum nitride (AlN).

The passivation film 108 of the third embodiment is formed in the following manner: An approximately 10-nm-thick second sub-film 108b made of SiN is deposited, for example, by plasma CVD to cover a barrier layer 104 and electrodes 105, 106 and 107, and then a first sub-film 108a made of AlN is deposited by DC sputtering as in the first embodiment to cover the second sub-film 108b.

In this case, the second sub-film 108b made of SiN is preferably 1 nm through 100 nm. This can further suppress the current collapse, and heat generated from a semiconductor layer is easily transferred to the first sub-film 108a made of AlN.

The thickness of the first sub-film 108a is desirably larger as seen from the simulation results of the lattice temperatures near the channel illustrated in FIG. 4 and, specifically, is desirably 1 μm or more, which allows the lattice temperature near the channel to become approximately 300° C. (approximately 580 K) or less.

According to the third embodiment, the second sub-film 108b made of SiN is deposited to be in contact with a semiconductor layer (barrier layer 104). This can provide both the effect of suppressing the current collapse which is brought by SiN and the effect of excellent heat dissipation which is brought by the first sub-film 108a made of AlN.

Figure 6B:
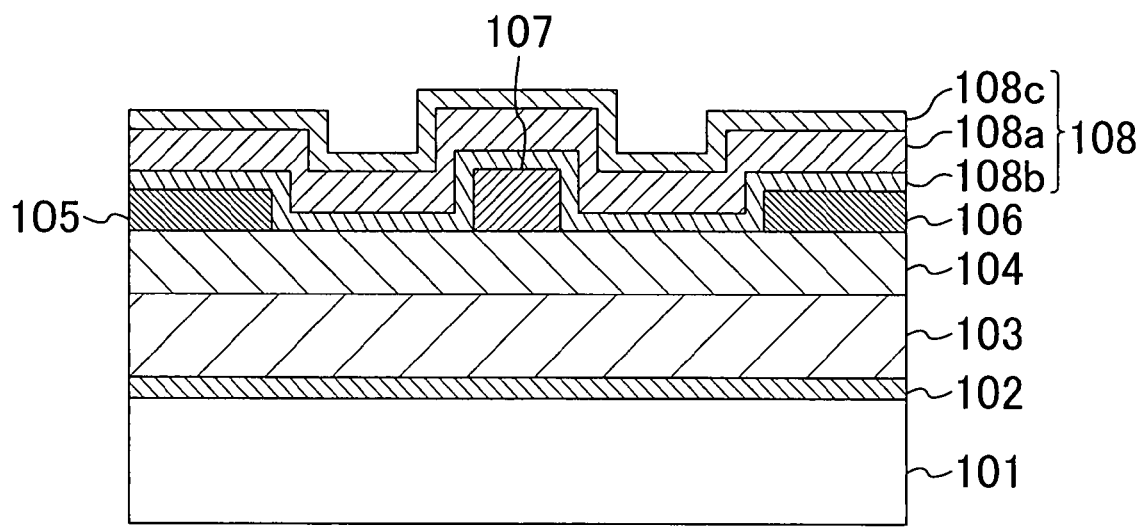
FIG. 6B is a cross-sectional view illustrating a semiconductor device according to a modification of the third embodiment of the present invention.

As illustrated in a modification of this embodiment in FIG. 6B, an approximately 1-nm-through 100-nm-thick third film 108c made of SiN may be formed to cover a first sub-film 108a made of AlN. This can suppress degradation of the device of this modification due to moisture from outside as in the second embodiment.

Immediately after the deposition of the second sub-film 108b, the first sub-film 108a may be deposited without being exposed to air. In this manner, the first sub-film 108a can be deposited on the second sub-film 108b with the second sub-film 108b kept clean. The third film 108c may be also deposited in the above-mentioned manner.

Embodiment 4

A fourth embodiment of the present invention will be described hereinafter with reference to the drawings.

Figure 7A:
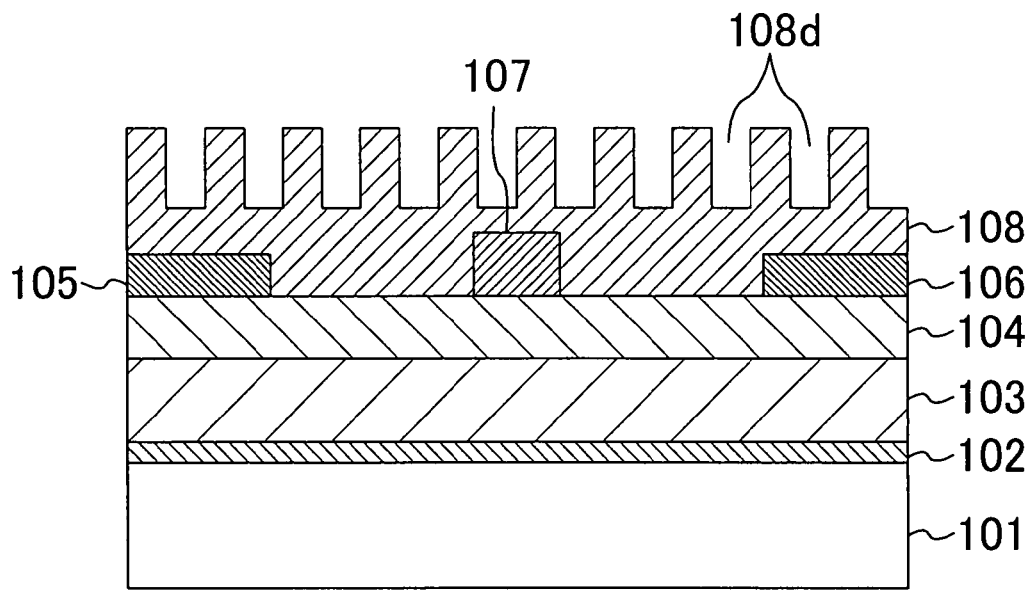
FIG. 7A is a cross-sectional view illustrating a semiconductor device according to a fourth embodiment of the present invention.

FIG. 7A illustrates a cross-sectional structure of a semiconductor device according to the fourth embodiment of the present invention. In FIG. 7A, the same components as those illustrated in FIG. 1 are denoted by the same reference numerals, and thus the description thereof is omitted.

As illustrated in FIG. 7A, the semiconductor device of the fourth embodiment is configured such that a plurality of recesses 108d are formed in the upper part of a passivation film 108, thereby allowing the surface of the passivation film 108 to become uneven. With this structure, the surface area of the passivation film 108 is increased. This allows heat generated by a HFET to be efficiently dissipated to the outside.

The plurality of recesses 108d may be dot-like or stripe-like. Alternatively, recesses 108d may be formed such that a plurality of dot-like projections are left in the upper part of the passivation film 108.

Figure 7B:
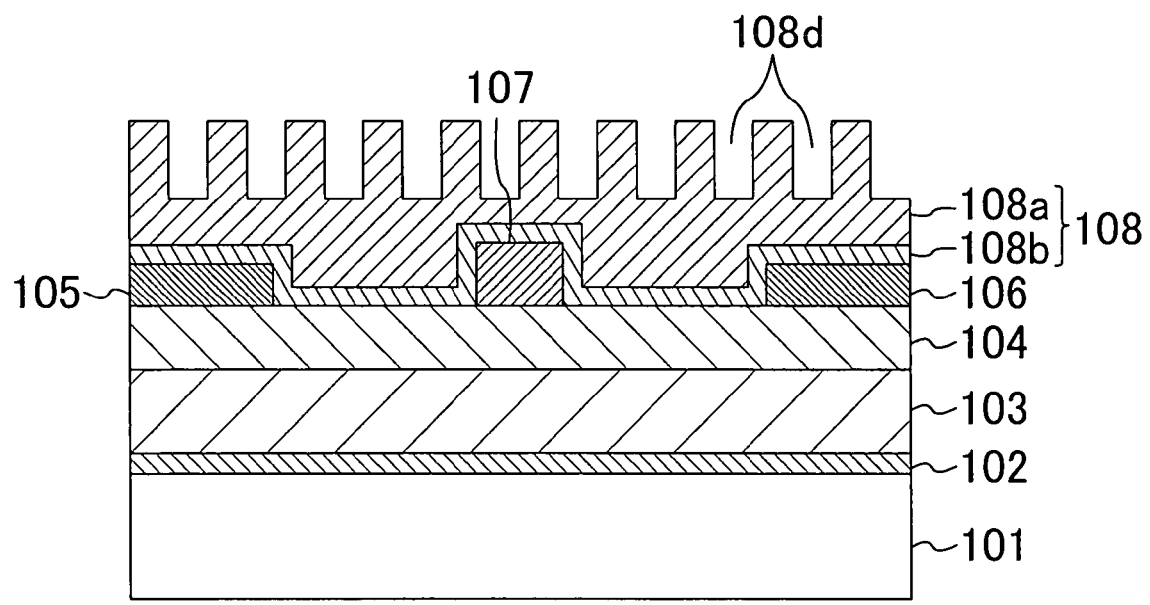
FIG. 7B is a cross-sectional view illustrating a semiconductor device according to a modification of the fourth embodiment of the present invention.

As in the second embodiment, as long as excellent heat dissipation can be ensured, a passivation film made of SiN may be stacked on the passivation film 108 made of AlN. Furthermore, as illustrated by a modification of the fourth embodiment in FIG. 7B, like the third embodiment, a second sub-film 108b made of SiN may be formed between a first sub-film 108a made of AlN and a barrier layer 104. Alternatively, a first sub-film 108a is vertically sandwiched between SiN films.

Embodiment 5

A fifth embodiment of the present invention will be described hereinafter with reference to the drawings.

Figure 8:
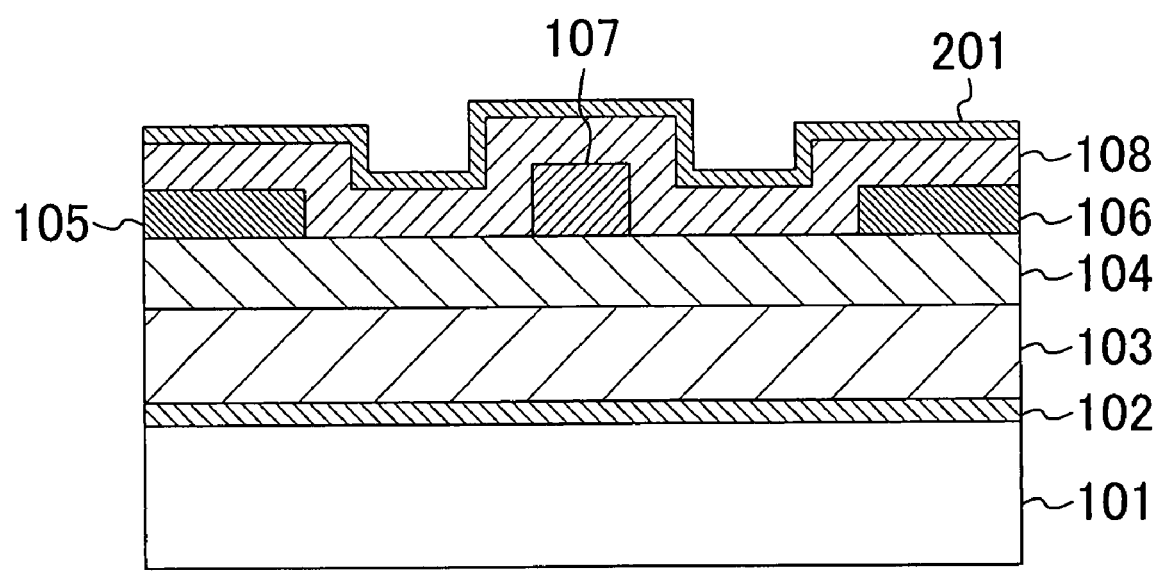
FIG. 8 is a cross-sectional view illustrating a semiconductor device according to a fifth embodiment of the present invention.

FIG. 8 illustrates a cross-sectional structure of a semiconductor device according to the fifth embodiment of the present invention. In FIG. 8, the same components as those illustrated in FIG. 1 are denoted by the same reference numerals, and the description thereof is omitted.

As illustrated in FIG. 8, the semiconductor device of the fifth embodiment is configured such that a heat dissipation film 201 made of a metal, such as gold (Au) or copper (Cu), is formed to cover a passivation film 108 formed of at least one layer and containing aluminum nitride. The thickness of the heat dissipation film 201 is preferably approximately 10 nm through 10 µm.

Figure 9:
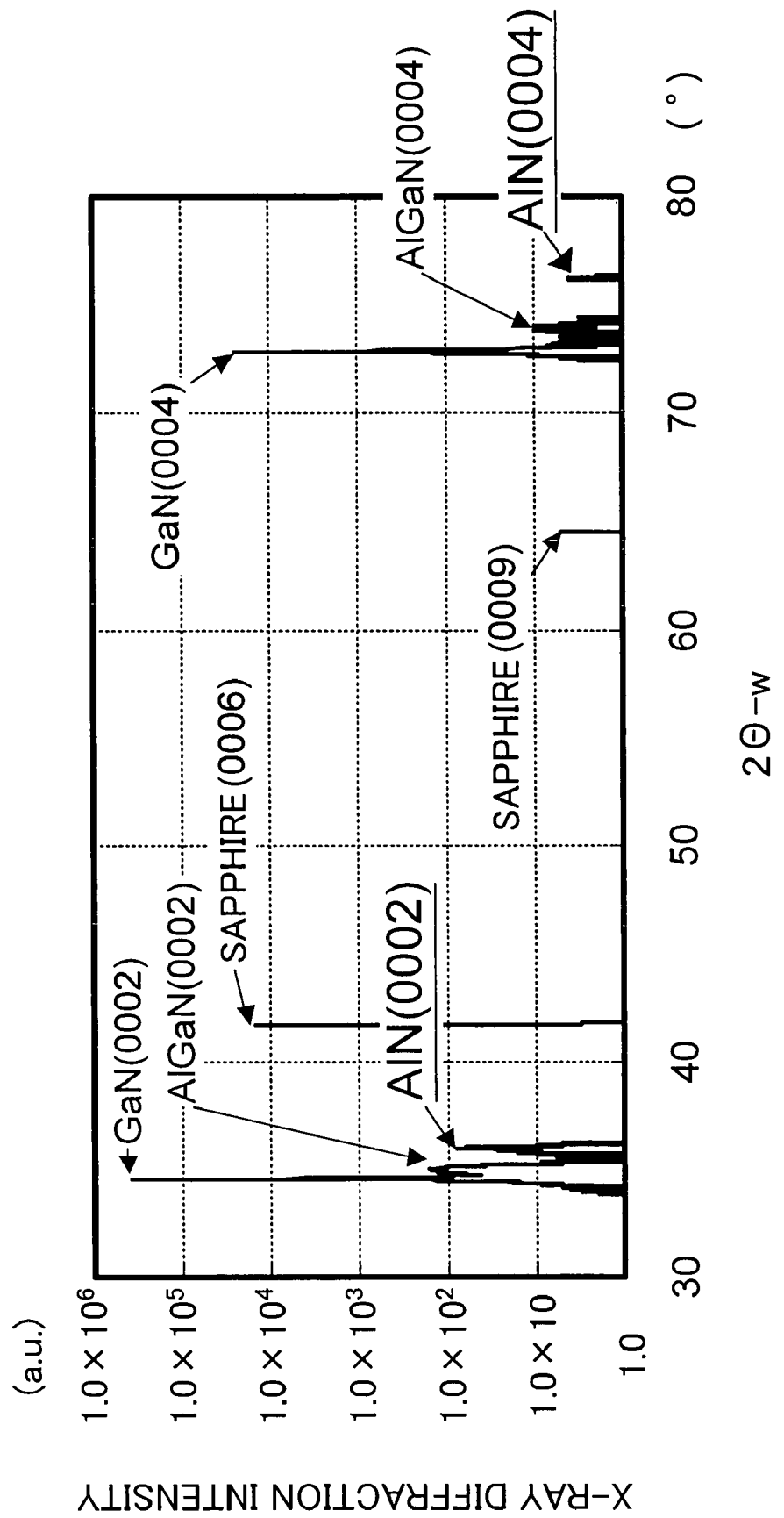
FIG. 9 is a graph illustrating X-ray analysis results of aluminum nitride deposited by sputtering according to the present invention.

As illustrated in FIG. 9, X-ray analysis of aluminum nitride (AlN) formed by sputtering shows that the aluminum nitride is strongly oriented along the C-axis of crystals. Thus, the thermal conductivity of the AlN formed by sputtering along the direction perpendicular to the C-axis becomes smaller than that along the C-axis. In view of the above, when the heat dissipation film 201 covers the passivation film 108, thermal diffusion not only along the C-axis but also along the direction perpendicular to the C-axis, i.e., along the in-plane direction of the semiconductor layer, can be promoted.

A material of the heat dissipation film 201 is not limited to metals and may be diamond, diamond-like carbon (DLC), a material containing carbon, or a multilayer film of the above-mentioned materials. As the material containing carbon, for example, aluminum carbide (AlC) or titanium carbide (TiC) can be used. Diamond, DLC and a material containing carbon have high thermal conductivity. Therefore, thermal diffusion along the in-plane direction of a semiconductor layer is promoted as in the case where a metal is used as the material of the heat dissipation film 201.

(Modification 1 of Embodiment 5)

Figure 10A:
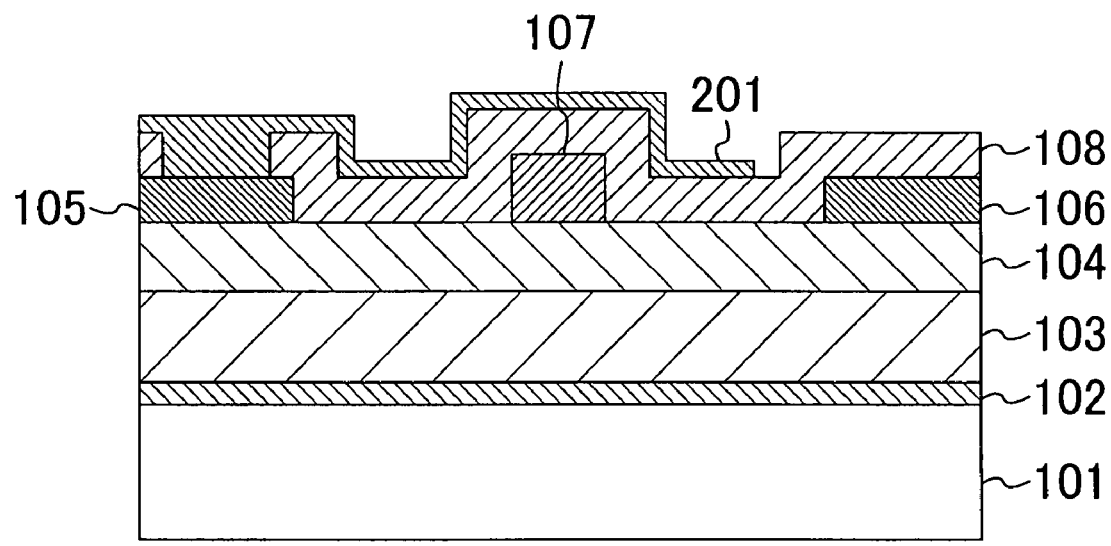
FIG. 10A is a cross-sectional view illustrating a semiconductor device according to a first modification of the fifth embodiment of the present invention.

FIG. 10A illustrates a cross-sectional structure of a semiconductor device according to a first modification of the fifth embodiment. As illustrated in FIG. 10A, one end of a heat dissipation film 201 formed on a passivation film 108 is connected to a source electrode 105, and the other end thereof is located between a gate electrode 107 and a drain electrode 106.

An electric field concentrates between the gate electrode 107 and the drain electrode 106, and a part of the semiconductor device therebetween locally produce the highest-temperature heat. In the first modification, the heat dissipation film 201 is formed as a so-called field plate, thereby suppressing the electric field concentration between the gate electrode 107 and the drain electrode 106 and achieving high breakdown voltage and efficient heat dissipation.

In the first modification, the heat dissipation film 201 and the source electrode 105 are connected to each other. However, this is not restrictive. The gate electrode 107 or the drain electrode 106 may be connected to the heat dissipation film 201.

(Modification 2 of Embodiment 5)

Figure 10B:
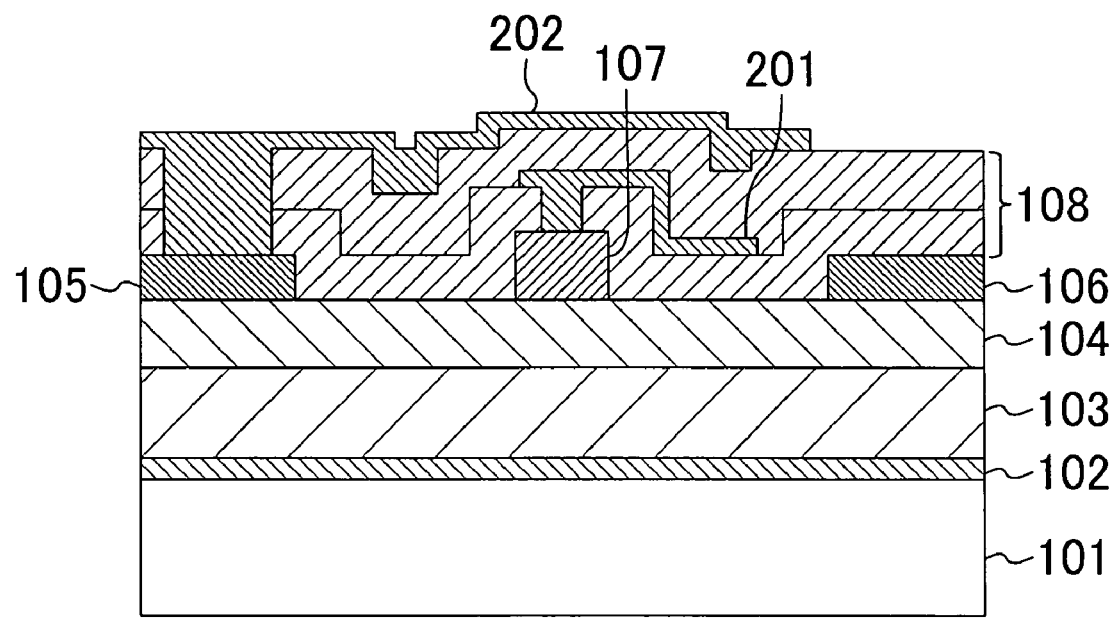
FIG. 10B is a cross-sectional view illustrating a semiconductor device according to a second modification of the fifth embodiment of the present invention.

FIG. 10B illustrates a cross-sectional structure of a semiconductor device according to a second modification of the fifth embodiment. As illustrated in FIG. 10B, a passivation film 108 is a layered film composed of at least a lower sub-film and an upper sub-film. A first heat dissipation film 201 is formed on the lower sub-film such that its one end is connected to a gate electrode 107 and the other end is located between the gate electrode 107 and a drain electrode 106. Furthermore, a second heat dissipation film 202 is formed on the upper sub-film of the passivation film 108 such that its one end is connected to a source electrode 105 and the other end is located between the gate electrode 107 and the drain electrode 106.

In the second modification, the first heat dissipation film 201 and the gate electrode 107 are connected to each other, and the second heat dissipation film 202 and the source electrode 105 are connected to each other. However, this is not restrictive. The first heat dissipation film 201 may be connected to the source electrode 105 or the drain electrode 106, and the second heat dissipation film 202 may be connected to the drain electrode 106 or the gate electrode 107.

The above-mentioned structure can suppress the electric field concentration between the gate electrode 107 and the drain electrode 106, achieve higher breakdown voltage and improve heat dissipation.

In each of the above-described first through fifth embodiments, a semiconductor device was described as an HFET made of a Group III nitride semiconductor. However, the semiconductor device of the present invention is not limited to an HFET. In other words, the present invention can be applied not only to an HFET but also to electronic devices, such as a heterojunction bipolar transistor (HBT) or a Schottky barrier diode (SBD), and light emitting devices, such as a light emitting diode (LED) or a semiconductor laser diode (LD).

Furthermore, a semiconductor material is not limited to a Group III nitride semiconductor and can be applied also to gallium arsenide (GaAs)- or indium phosphide (InP)-based compound semiconductor or a silicon (Si) semiconductor.

In the above-mentioned manner, the semiconductor device of the present invention can prevent degradation in device characteristics due to a temperature rise and is useful for semiconductor devices for use in millimeter wave communications or power switching applications, in particular, a semiconductor device made of a Group III nitride semiconductor.

What is claimed is:

1. A semiconductor device comprising:
   a semiconductor layer;
   at least one electrode formed on the semiconductor layer to be in contact with the semiconductor layer; and
   a passivation film covering the semiconductor layer and at least part of the top surface of the electrode to protect the semiconductor layer and formed of a plurality of sub-films, the passivation film including a first sub-film made of aluminum nitride,
   wherein
   the at least one electrode comprises a gate electrode and a source electrode and a drain electrode located to both sides of the gate electrode, respectively, and apart from the gate electrode, and
   the surface of the passivation film is uneven so that the passivation film has a plurality of concave surfaces and a plurality of convex surfaces between the source electrode and the gate electrode and a plurality of concave surfaces and a plurality of convex surfaces between the drain electrode and the gate electrode.

2. A semiconductor device comprising:
   a semiconductor layer;
   at least one electrode formed on the semiconductor layer to be in contact with the semiconductor layer; and
   a passivation film covering the semiconductor layer and at least part of the top surface of the electrode to protect the semiconductor layer and formed of a plurality of sub-films, the passivation film including a first sub-film made of aluminum nitride,
   wherein the semiconductor device further comprises a heat dissipation film formed on the passivation film and made of a material having larger thermal conductivity than aluminum nitride, and
   the heat dissipation film is in contact with the first sub-film.

3. The semiconductor device of claim 2, wherein the heat dissipation film is made of a metal.

4. The semiconductor device of claim 3, wherein the heat dissipation film is electrically connected to the electrode.

5. A semiconductor device comprising:
a semiconductor layer;
at least one electrode formed on the semiconductor layer to be in contact with the semiconductor layer; and
a passivation film covering the semiconductor layer and at least part of the top surface of the electrode to protect the semiconductor layer and formed of a plurality of sub-films, the passivation film including a first sub-film made of aluminum nitride, wherein the semiconductor device further comprises a heat dissipation film formed on the passivation film and made of a material having larger thermal conductivity than aluminum nitride, and the heat dissipation film is made of diamond, diamond-like carbon, or a material containing carbon.

* * * * *